United States Patent
Yan et al.

(10) Patent No.: US 10,928,429 B2
(45) Date of Patent: Feb. 23, 2021

(54) INSULATION DETECTION DEVICE AND METHOD FOR ENERGY STORAGE SYSTEM

(71) Applicant: Contemporary Amperex Technology Co., Limited, Ningde (CN)

(72) Inventors: Zhiwei Yan, Ningde (CN); Qiandeng Li, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 64 days.

(21) Appl. No.: 16/290,974

(22) Filed: Mar. 4, 2019

(65) Prior Publication Data

US 2020/0025814 A1   Jan. 23, 2020

(30) Foreign Application Priority Data

Jul. 17, 2018   (CN) .......................... 201810782063.5

(51) Int. Cl.
*G01R 27/14* (2006.01)
*G01R 31/52* (2020.01)
(Continued)

(52) U.S. Cl.
CPC .................... *G01R 27/14* (2013.01)

(58) Field of Classification Search
CPC ...... G01R 31/50; G01R 27/025; G01R 27/18; G01R 31/52; G01R 31/36; G01R 31/12;
(Continued)

(56) References Cited

U.S. PATENT DOCUMENTS

2010/0237872 A1   9/2010  Kang et al.
2013/0082715 A1   4/2013  Kawamura
(Continued)

FOREIGN PATENT DOCUMENTS

CN    1687799 A    10/2005
CN   102998529 A    3/2013
(Continued)

OTHER PUBLICATIONS

The extended European search report dated Nov. 4, 2019 for European application No. 19161117.7, 11 pages.
(Continued)

*Primary Examiner* — Tung X Nguyen
*Assistant Examiner* — Feba Pothen
(74) *Attorney, Agent, or Firm* — Law Offices of Liaoteng Wang

(57) ABSTRACT

The present disclosure provides an insulation detection device and method for an energy storage system. The insulation detection device includes a positive switching device, a negative switching device, a sampling unit, a reference voltage terminal and a processor. The sampling unit is configured to collect a positive sampled signal on the energy storage device when the positive switching device and the negative switching device are in a first switching state, and collect a negative sampled signal on the energy storage device when the positive switching device and the negative switching device are in a second switching state; and the processor is configured to determine a positive insulation resistance value and a negative insulation resistance value of the energy storage device according to the positive sampled signal and the negative sampled signal.

7 Claims, 8 Drawing Sheets

(51) Int. Cl.
*G01R 31/12* (2020.01)
*G01R 27/02* (2006.01)

(58) Field of Classification Search
CPC .. G01R 27/14; H01M 2200/00; B60L 3/0069; B60L 58/10
See application file for complete search history.

(56) References Cited

U.S. PATENT DOCUMENTS

| | | |
|---|---|---|
| 2014/0095093 A1 | 4/2014 | Hong et al. |
| 2014/0159908 A1 | 6/2014 | Hong et al. |
| 2014/0333321 A1 | 11/2014 | Kawamura et al. |
| 2015/0293167 A1 | 10/2015 | Kawamura et al. |
| 2016/0096433 A1* | 4/2016 | Gale .................. G01R 27/025 701/31.9 |
| 2017/0016951 A1 | 1/2017 | Sung et al. |
| 2017/0176509 A1 | 6/2017 | Schulz |
| 2018/0224494 A1* | 8/2018 | Iwanabe ................ G01R 31/64 |

FOREIGN PATENT DOCUMENTS

| | | |
|---|---|---|
| CN | 103688183 B | 4/2016 |
| CN | 105842540 A | 8/2016 |
| CN | 107860975 A | 3/2018 |
| CN | 207473060 U | 6/2018 |
| KR | 101388466 B1 | 4/2014 |

OTHER PUBLICATIONS

The First Official Action and search report dated May 6, 2020 for Chinese application No. 201810782063.5, 21 pages.
The Examination report dated Aug. 3, 2020 for European application No. 19161117.7, 13 pages.
The second Official Action and search report dated Jul. 24, 2020 for Chinese application No. 201810782063.5, 21 pages.
Yaoyuan Liu: "Electrical and Electronic Technology", Beijing University of Technology Press, Sep. 30, 2006, p. 56.

* cited by examiner

INSULATION DETECTION DEVICE AND METHOD FOR ENERGY STORAGE SYSTEM

CROSS-REFERENCE TO RELATED APPLICATION

This application is based upon and claims priority to Chinese Patent Application No. 201810782063.5, filed on Jul. 17, 2018, the content of which is incorporated herein by reference in its entirety.

FIELD

The present disclosure relates to the field of energy storage systems, and particularly to an insulation detection device and method for an energy storage system.

BACKGROUND

The energy storage system is used to store and supply electrical energy. In the energy storage system, an insulation fault may directly affect normal operations of equipment, and even cause a safety accident in severe cases. For example, when a short circuit is formed between a high voltage positive electrode and the ground and a person touches a corresponding high voltage negative electrode, loss of life and property may be caused.

Therefore, it is necessary to conduct insulation detection on the energy storage system to monitor in real-time whether an insulation resistance value between the positive and negative electrodes of the energy storage system reaches a standard value, thereby avoiding safety issues caused by the insulation resistance value between the positive and negative electrodes of the energy storage system failing to reach the standard value.

At present, when conducting insulation sampling on an energy storage device in the energy storage system, it is generally required to collect data about the positive insulation resistance and the negative insulation resistance of the energy storage device on different sampling channels, and derive the positive insulation resistance and the negative insulation resistance according to the data collected on the different sampling channels. An insulation sampling circuit may have a high complexity and measurement accuracy of the insulation resistance may be limited.

SUMMARY

The embodiments of the present disclosure provide an insulation detection device and method for an energy storage system.

In a first aspect, the embodiments of the present disclosure provide an insulation detection device for an energy storage system. The insulation detection device includes a positive switching device, a negative switching device, a sampling unit, a reference voltage terminal and a processor.

A positive electrode of an energy storage device is connected to a first end of the positive switching device, a negative electrode of the energy storage device is connected to a first end of the negative switching device, a second end of the positive switching device and a second end of the negative switching device are respectively connected to a first end of the sampling unit, and a second end of the sampling unit is connected to the reference voltage terminal.

The sampling unit is configured to collect a positive sampled signal on the energy storage device when the positive switching device and the negative switching device are in a first switching state, and to collect a negative sampled signal on the energy storage device when the positive switching device and the negative switching device are in a second switching state.

The processor is connected to a third end of the sampling unit, and configured to determine a positive insulation resistance value and a negative insulation resistance value of the energy storage device according to the positive sampled signal and the negative sampled signal.

In some embodiments according to the first aspect, the sampling unit includes a sampling isolation switch, a first resistor network and a second resistor network, wherein a first end of the sampling isolation switch is connected to the second end of the positive switching device and the second end of the negative switching device; a second end of the sampling isolation switch is connected to a first end of the first resistor network; a second end of the first resistor network is connected to a first end of the second resistor network; and a second end of the second resistor network is connected to the reference voltage terminal.

In some embodiments according to the first aspect, the insulation detection device further includes an acceleration switch and an acceleration resistor network, wherein a first end of the acceleration switch is connected to the first end of the first resistor network, and a second end of the acceleration switch is connected to a first end of the acceleration resistor network; and a second end of the acceleration resistor network is connected to the second end of the second resistor network.

In some embodiments according to the first aspect, the insulation detection device further includes an insulation detection sampling point positioned at the third end of the sampling unit and connected to the processor.

The sampling unit is further configured to collect the positive sampled signal on the energy storage device via the insulation detection sampling point when the positive switching device and the negative switching device are in the first switching state; and collect the negative sampled signal on the energy storage device via the insulation detection sampling point when the positive switching device and the negative switching device are in the second switching state.

In some embodiments according to the first aspect, the insulation detection device further includes an insulation detection sampling point connected to the second end of the first resistor network, the first end of the second resistor network and the processor.

In some embodiments according to the first aspect, the first switching state includes a switch-on state of the positive switching device and a switch-off state of the negative switching device; and the second switching state includes a switch-off state of the positive switching device and a switch-on state of the negative switching device.

In some embodiments according to the first aspect, the positive switching device includes a positive isolation switch, and the positive electrode of the energy storage device is connected to the first end of the sampling unit through the positive isolation switch; and the negative switching device includes a negative isolation switch, and the negative electrode of the energy storage device is connected to the first end of the sampling unit through the negative isolation switch.

In some embodiments according to the first aspect, the processor is further configured to determine a lower resistance value of the positive insulation resistance value and the negative insulation resistance value as an insulation resistance value of the energy storage system; compare the insulation resistance value of the energy storage system and a preset insulation resistance threshold to obtain a comparison result of the insulation resistance value of the energy storage system; and determine an insulation state of the energy storage system according to the comparison result of the insulation resistance value of the energy storage system.

In a second aspect, the embodiments of the present disclosure provide an insulation detection method for an energy storage system to be implemented in the above insulation detection device for the energy storage system. The insulation detection method includes controlling the positive switching device to switch on and the negative switching device to switch off, and collecting a first positive sampled signal by the insulation detection device; controlling the positive switching device to switch off and the negative switching device to switch on, and collecting a first negative sampled signal by the insulation detection device; and calculating the positive insulation resistance value and the negative insulation resistance value of the energy storage device according to the first positive sampled signal and the first negative sampled signal.

In some embodiments according to the second aspect, calculating the positive insulation resistance value and the negative insulation resistance value of the energy storage device according to the first positive sampled signal and the first negative sampled signal includes: converting the first positive sampled signal into a first positive sampled voltage; converting the first negative sampled signal into a first negative sampled voltage; and calculating the positive insulation resistance value and the negative insulation resistance value of the energy storage device according to the first positive sampled voltage and the first negative sampled voltage.

In some embodiments according to the second aspect, the insulation detection device further includes an acceleration switch and an acceleration resistor network, and the insulation detection method further includes controlling the acceleration switch to switch on, the positive switching device to switch on and the negative switching device to switch off, and collecting a second positive sampled signal by the insulation detection device; controlling the acceleration switch to switch on, the positive switching device to switch off and the negative switching device to switch on, and collecting a second negative sampled signal by the insulation detection device; and calculating the positive insulation resistance value and the negative insulation resistance value of the energy storage device according to the second positive sampled signal and the second negative sampled signal.

In some embodiments according to the second aspect, the insulation detection method further includes converting the second positive sampled signal into a second positive sampled voltage; converting the second negative sampled signal into a second negative sampled voltage; and calculating the positive insulation resistance value and the negative insulation resistance value of the energy storage device according to the second positive sampled voltage and the second negative sampled voltage.

BRIEF DESCRIPTION OF THE DRAWINGS

To more clearly illustrate technical solutions of embodiments of the present disclosure, the accompanying drawings, which are to be referred by the embodiments of the present disclosure, will be briefly described. Those skilled in the art will be able to obtain additional drawings in accordance with these drawings without any creative work.

DETAILED DESCRIPTION

Figure 1:
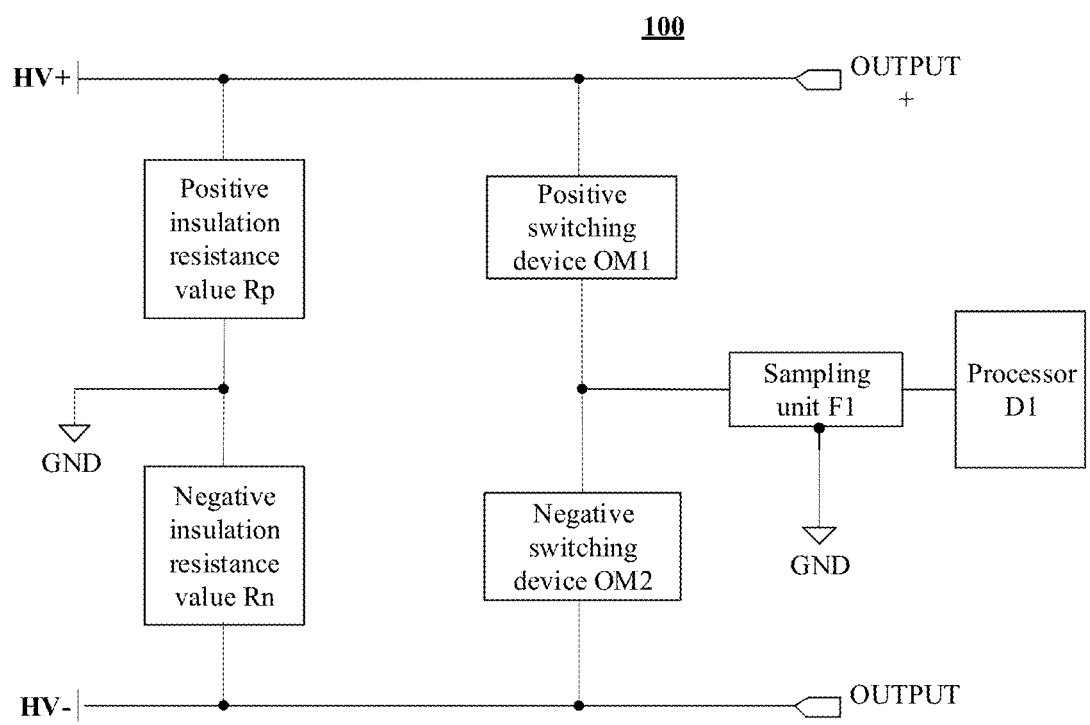
FIG. 1 is a module structural diagram of an insulation detection device according to an embodiment of the present disclosure.

Various aspects of features and exemplary embodiments of the present disclosure will be described in detail below. The present disclosure will be provided in further detail below in conjunction with accompanying drawings and embodiments in order to make objects, technical solutions and advantages of the present disclosure to be more clearly understood. It is to be appreciated that the specific embodiments described herein are to be construed to illustrate the present disclosure but not to limit the present disclosure. It will be apparent to those skilled in the art that the present disclosure may be practiced without some of these specific details. The following description of the embodiments is merely to provide a better understanding of the present disclosure by illustrating examples thereof.

It is to be noted that relational terms such as first, second and the like are used herein only to distinguish an entity or operation from another entity or operation without requiring or implying that there is any such actual relationship or order between these entities or operations. Moreover, the term "comprise", "include" or any other variant thereof is intended to encompass a non-exclusive inclusion, such that a process, method, article or device that includes a series of elements includes not only these elements but also other elements that are not explicitly listed or those elements that are inherent to such a process, method, article or device. In the absence of more restrictions, elements defined by the statement "includes . . . " do not preclude the presence of additional identical elements in the process, method, article or device that includes the elements.

In embodiments of the present disclosure, the energy storage device in the energy storage system may be a variety of types of power storage units. For example, the energy storage device may be a lithium-ion power storage unit, a lead-acid power storage unit, a nickel-cadmium power storage unit, a nickel-hydrogen power storage unit, a lithium-sulfur power storage unit, or a sodium-ion power storage unit. In terms of scale, the power storage unit can be a single cell or a battery module or a battery pack, which is not limited herein.

An energy storage system generally has a high voltage, such as hundreds of volts. When the energy storage system is in normal operation, positive and negative buses of a battery system and a case of equipment may have good insulation performance. However, if the insulation is damaged during use, leakage of electricity may occur, which may threaten personal and property safety of an operator. Therefore, in a high voltage energy storage system, it is important to detect an insulation resistance of an energy storage device in the energy storage system.

In view of this, embodiments of the present disclosure provide an insulation detection device and an insulation detection method for the energy storage system. The insulation detect device can monitor in real-time whether an insulation resistance value between positive and negative electrodes of the energy storage device reaches a standard value.

In order to better understand the present disclosure, the insulation detection device and the insulation detection method for the energy storage system according to embodiments of the present disclosure will be described in detail below with reference to the accompanying drawings. It should be noted that these embodiments are not intended to limit the scope of the present disclosure.

FIG. 1 is a module structural diagram of an insulation detection device according to an embodiment of the present disclosure. As shown in FIG. 1, the insulation detection device 100 in the embodiment includes a positive switching device OM1, a negative switching device OM2, a sampling unit F1, a reference voltage terminal GND, and a processor D1.

In the embodiment, a positive electrode of an energy storage device is connected to a first end of the positive switching device OM1, a negative electrode of the energy storage device is connected to a first end of the negative switching device OM2, a second end of the positive switching device OM1 and a second end of the negative switching device OM2 are respectively connected to a first end of the sampling unit F1, and a second end of the sampling unit F1 is connected to the reference voltage terminal.

The sampling unit F1 is configured to collect a positive sampled signal on the energy storage device when the positive switching device OM1 and the negative switching device OM2 are in a first switching state, and to collect a negative sampled signal on the energy storage device when the positive switching device OM1 and the negative switching device OM2 are in a second switching state.

As shown in FIG. 1, the processor D1 is connected to a third end of the sampling unit F1, and the processor D1 is configured to determine a positive insulation resistance value and a negative insulation resistance value of the energy storage device according to the positive sampled signal and the negative sampled signal.

In an embodiment, the first switching state includes a switch-on state of the positive switching device OM1 and a switch-off state of the negative switching device OM2, and the second switching state includes a switch-off state of the positive switching device OM1 and a switch-on state of the negative switching device OM2.

In the embodiment, it is possible to use a same sampling channel to respectively sample a voltage value of the high voltage positive electrode relative to the ground and a voltage value of the high voltage negative electrode relative to the ground, thereby reducing the circuit complexity. Moreover, it is possible to avoid interference and influence on the sampled data due to the difference between different sampling circuits when voltage sampling is performed by a plurality of sampling circuits, thereby improving the measurement accuracy of the sampled signal during insulation detection.

An insulation detection device for the energy storage system according to another embodiment of the present disclosure may be described below with reference to FIG. 2 which shows a module structural diagram of the insulation detection device according to another embodiment of the present disclosure.

Figure 2:
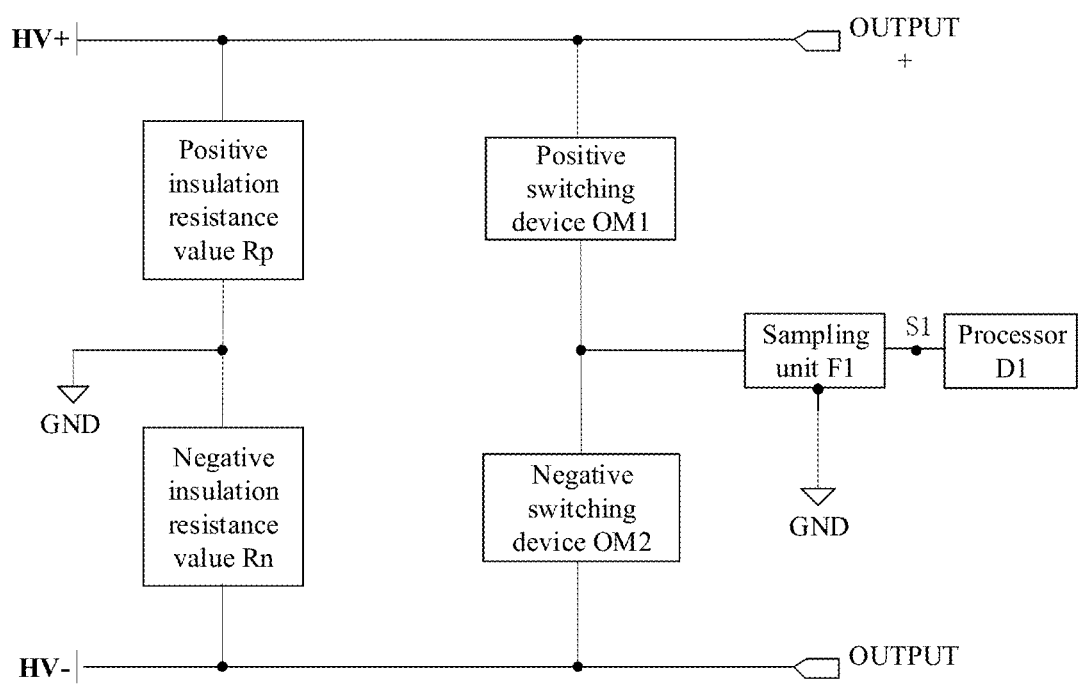
FIG. 2 is a module structural diagram of an insulation detection device according to another embodiment of the present disclosure.

As shown in FIG. 2, in some embodiments, the insulation detection device may further include an insulation detection sampling point S1 (which may be simply referred to as a sampling point S1 hereinafter). The sampling point S1 may be positioned at the third end of the sampling unit F1 and connected to the processor D1.

As shown in FIG. 2, the positive switching device OM1 and the negative switching device OM2 are configured to allow the positive sampled signal to be collected from the positive electrode of the energy storage device at the insulation detection sampling point S1 when the OM1 and OM2 are in the first switching state, and allow the negative sampled signal to be collected from the negative electrode of the energy storage device at the insulation detection sampling point S1 when the OM1 and OM2 are in the second switching state.

In the embodiment, the first switching state includes the switch-on state of the positive switching device OM1 and the switch-off state of the negative switching device OM2, and the second switching state includes the switch-off state of the positive switching device OM1 and the switch-on state of the negative switching device OM2.

With continued reference to FIG. 2, in the embodiment of the present disclosure, the sampling unit F1 is connected to the reference voltage terminal. The actual voltage at the reference voltage terminal GND can be set according to working environment and requirements of an insulation detection circuit.

In an embodiment, the reference voltage terminal GND may be, for example, a low voltage ground. As an example, if the insulation detection device is applied to a new energy vehicle, the low pressure ground may be a vehicle body ground, which means that a voltage at a chassis of the vehicle is used as the reference voltage. Such grounding can be implemented by contact between metal conductors, and the connection resistance and reactance are generally very small to ensure good grounding.

The voltage at the reference voltage terminal GND is the reference voltage in the insulation detecting circuit, that is, the reference voltage. For example, if the actual voltage at the reference voltage terminal GND is 6V and the actual voltage of the sampled signal collected at the sampling point S1 is 22V, the voltage of the sampled signal collected at the sampling point S1 can be recorded as 16V.

In the following description of the embodiments, the actual voltage of the sampled signal collected at the sampling point S1 is determined by taking the reference voltage terminal GND as the low voltage ground as an example, but the exemplary description should not be construed as a limitation to the reference voltage terminal.

In the embodiments of the present disclosure, the positive switching device and the negative switching device are usually positioned at a high voltage side, and the sampling unit is usually positioned at a low voltage side. In order to perform an isolated control of high and low voltages, the positive switching device OM1 and the negative switching device OM2 may be isolation switches such as an optical coupler. The optical coupler may also be referred to as a photoelectric isolator or a photoelectric coupler, simply referred to as an optocoupler.

In an embodiment, the optical coupler is an electrical-optical-electrical conversion device that transmits an electrical signal in the form of light, and is composed of a light emitting element and a photosensitive element. The optical coupler can encapsulate the light emitting element and the photosensitive element in a same closed case, and the light emitting element and the photosensitive element are separated by a transparent insulator.

For ease of understanding, operation principles of the optical coupler will be briefly described below. In the optical coupler, the light emitting element can convert an input electrical signal into an optical signal and transmit the optical signal to the photosensitive element with the light as a transmission medium, and the photosensitive element can convert the optical signal to an electrical signal to be output. Since there is no direct electrical connection, while coupling and transmitting signals, the interference on low voltage signals caused by high voltage signals can be effectively controlled and the isolated control of high and low voltage signals can be realized.

In an embodiment, the light emitting element may be, for example, a light emitting diode, and the photosensitive element may be, for example, a photodiode or a phototransistor.

In the embodiment of the present disclosure, conversion circuits of different levels can be utilized to control the switch-on and switch-off of the positive switching device and the negative switching device.

As an example, when a conversion circuit of the positive switching device OM1 outputs a high level, the positive switching device OM1 can be controlled to be in the switch-on state; and when the conversion circuit of the positive switching device OM1 outputs a low level, the positive switching device OM1 can be controlled to be in the switch-off state.

As an example, when a conversion circuit of the negative switching device OM2 outputs a high level, the negative switching device OM2 can be controlled to be in the switch-on state; and when the conversion circuit of the negative switching device OM2 outputs a low level, the negative switching device OM2 can be controlled to be in the switch-off state.

In an embodiment, if the isolated control of high and low voltages is implemented by using the optocoupler, no additional isolation unit for the isolated control is required between a high voltage ground signal and a low voltage ground signal, and thus the circuit structure may be simplified.

In the embodiment of the present disclosure, the isolation switches are used and the insulation detection circuit does not need to additionally include an isolation module, which can avoid introducing a new interference signal, thereby improving the accuracy of the sampled signal.

Figure 3:
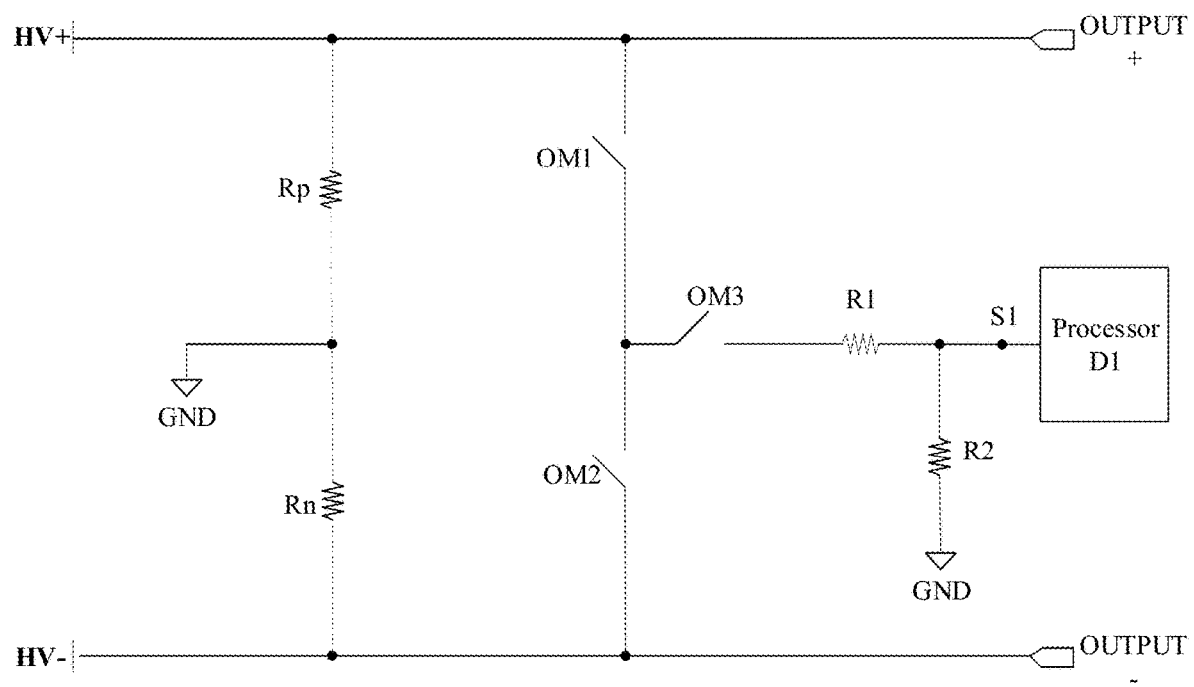
FIG. 3 is a circuit structural diagram of an insulation detection device according to an exemplary embodiment of the present disclosure.

FIG. 3 is a circuit structural diagram of an insulation detection device according to an exemplary embodiment of the present disclosure. FIG. 3 schematically shows specific structures of the positive switching device OM1, the negative switching device OM2, the sampling unit F1, and the reference voltage terminal GND.

As shown in FIG. 3, in an embodiment, the positive switching device OM1 may include a positive isolation switch, and the positive electrode of the energy storage device is connected to the first end of the sampling unit F1 through the positive isolation switch; the negative switching device OM2 may include a negative isolation switch, and the negative electrode of the energy storage device is connected to the first end of the sampling unit F1 through the negative isolation switch.

In an embodiment, the sampling unit F1 may include a sampling isolation switch OM3, a first resistor network R1, and a second resistor network R2.

A first end of the sampling isolation switch OM3 is connected to the second end of the positive switching device OM1 and the second end of the negative switching device OM2.

A second end of the sampling isolation switch OM3 is connected to a first end of the first resistor network R1.

A second end of the first resistor network R1 is connected to a first end of the second resistor network R2; a second end of the second resistor network R2 may be connected to the reference voltage terminal GND.

In the embodiment, the first resistor network R1 and the second resistor network R2 can function as a voltage divider. By adjusting the resistance value of the first resistor network R1 and the resistance value of the second resistor network R2, a variation range of the positive sampled signal collected at the sampling point S1 in the first switching state and a variation range of the negative sampled signal collected at the sampling point S1 in the second switching state may be adjusted.

It should be noted that the combination form and the resistance values of the first resistor network R1 and the second resistor network R2 can be set according to actual conditions in an actual application scenario of battery insulation detection.

In an embodiment, the sampling isolation switch OM3 may also be an isolation switch such as an optocoupler. Conversion circuits of different levels can be utilized to control the switch-on and switch-off of the sampling isolation switch OM3. As an example, the sampling isolation switch OM3 can be controlled to be in the switch-on state when a conversion circuit of the sampling isolation switch OM3 outputs a high level; and the sampling isolation switch OM3 can be controlled to be in the switch-off state when the conversion circuit of the sampling isolation switch OM3 outputs a low level.

With continued reference to FIG. 3, in an embodiment, in the insulation detection device, the insulation detection sampling point S1 is connected to the second end of the first resistor network R1, the first end of the second resistor network R2, and the processor D1. When the sampling isolation switch OM3 is in the switch-on state: in the first switching state of the positive switching device OM1 and the negative switching device OM2, the sampling unit F1 supplies a positive sampled signal to the sampling point S1, and in the second switching state of the positive switching device OM1 and the negative switching device OM2, the sampling unit F1 supplies a negative sampled signal to the sampling point S1.

As described in the foregoing embodiments, the first switching state includes the switch-on state of the positive switching device OM1 and the switch-off state of the negative switching device OM2, and the second switching state includes the switch-off state of the positive switching device OM1 and the switch-on state of the negative switching device OM2.

Figure 4:
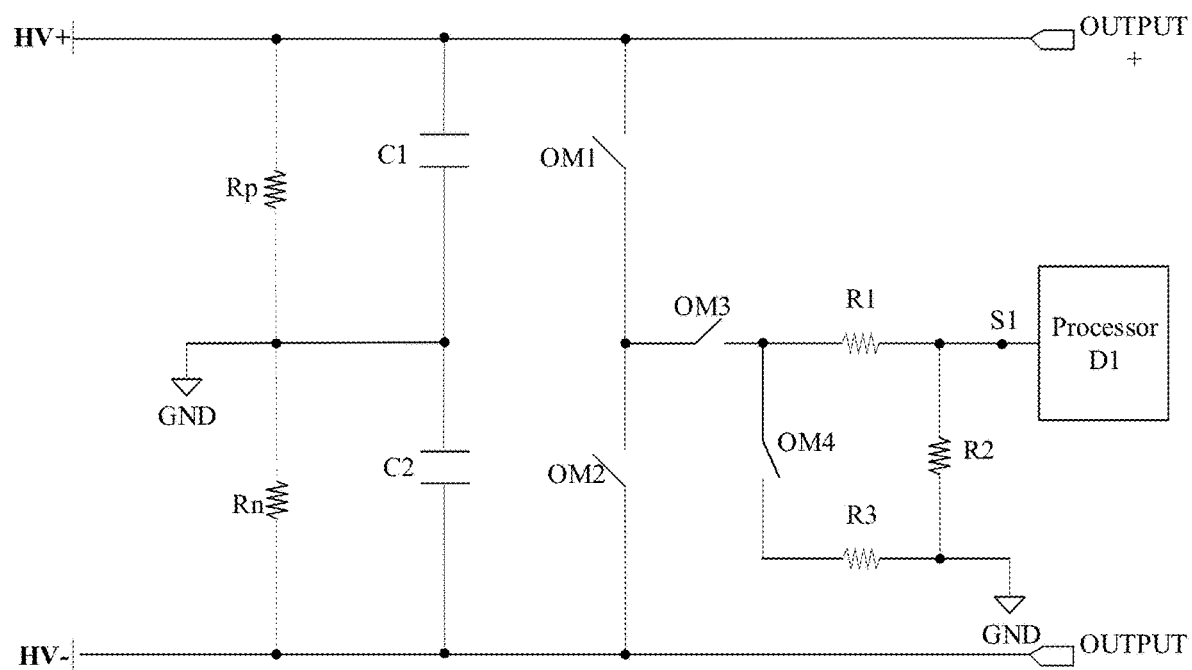
FIG. 4 is a circuit structural diagram of an insulation detection device according to another exemplary embodiment of the present disclosure.

An insulation detection device for the energy storage system according to another embodiment of the present disclosure will be described in detail below with reference to FIG. 4, FIG. 5a and FIG. 5b. FIG. 4 is a circuit structural diagram of an insulation detection device according to another exemplary embodiment of the present disclosure.

For convenience of description, in the following embodiments, the first resistor network R1 and the second resistor network R2 may be regarded as a sampling resistor network of the sampling module F1.

As shown in FIG. 4, in an embodiment, the insulation detection device of the energy storage system may further include an acceleration switch OM4 and an acceleration resistor network R3.

An end of the acceleration switch OM4 is connected to the first end of the first resistor network R1, and the other end of the acceleration switch OM4 is connected to an end of the acceleration resistor network R3; and the other end of the acceleration resistor network R3 is connected to the second end of the second resistor network R2.

In an embodiment, the acceleration switch OM4 may be an isolation switch such as an optocoupler. Conversion circuits of different levels can be utilized to control the switch-on and switch-off of the acceleration switch OM4. As an example, the acceleration switch OM4 can be controlled to be in the switch-on state when a conversion circuit of the acceleration switch OM4 outputs a high level; and the acceleration switch OM4 can be controlled to be in the switch-off state when the conversion circuit of the acceleration switch OM4 outputs a low level.

In embodiments of the present disclosure, a distributed capacitor may exist between an energy storage high voltage and an energy storage low voltage, which is an equivalent capacitor between a high voltage component of the energy storage device and a low voltage component of the energy storage device. The insulation detection device in embodiments of the present disclosure employs the isolation switches to perform an isolated control of a high voltage end and a low voltage end of the energy storage system. A first distributed capacitor exists between the positive electrode of the energy storage device and the reference voltage terminal, and a second distributed capacitor exists between the negative electrode of the energy storage device and the reference voltage terminal.

In embodiments of the present disclosure, the sampling unit F1 needs to collect a stable positive sampled signal provided by the energy storage device, such as a stable voltage value at the positive electrode of the energy storage device relative to the low voltage ground, when the positive switching device OM1 and the negative switching device OM2 are in the first switching state; and collect a stable negative sampled signal provided by the energy storage device, such as a stable voltage value at the negative electrode of the energy storage device relative to the low voltage ground, when the positive switching device OM1 and the negative switching device OM2 are in the second switching state.

In the embodiment, when the positive switching device OM1 and the negative switching device OM2 are in the first switching state and a capacitance value of the second distributed capacitor is a determined value, the acceleration switch OM4 is switched on and thus the acceleration resistor network R3 can be connected in the insulation detection device, thereby accelerating the voltage stabilization on the second distributed capacitor and shortening the sampling time for the positive sampled signal; and when the positive switching device OM1 and the negative switching device OM2 are in the second switching state and a capacitance value of the first distributed capacitor is a determined value, the acceleration resistor network R3 can be connected in the insulation detection device, thereby accelerating the voltage stabilization on the first distributed capacitor and shortening the sampling time for the negative sampled signal.

In the embodiments of the present disclosure, according to the principle of RC charging and discharging, a resistance value of an equivalent resistor R in an RC charge and discharge circuit can be reduced by paralleling resistors. In the RC charge and discharge circuit, when a capacitance value of a capacitor C is determined, by reducing the resistance value of the resistor R, the charging and discharging of the capacitor C can be accelerated and the voltage of the energy storage system can be stabilized more quickly.

For ease of understanding, the operation principle of accelerating voltage stabilization by using the acceleration resistor network R3 so as to shorten the insulation sampling time, will be described below by way of a specific embodiment.

As shown in FIG. 4, in an embodiment, when the sampling isolation switch OM3 and the acceleration switch OM4 are in the switch-on state and the positive switching device OM1 and the negative switching device OM2 are in the second switching state, a first insulation detection circuit may be formed by the positive electrode of the energy storage device, the first distributed capacitor C1, the first resistor network R1, the second resistor network R2, the acceleration resistor network R3, and the negative electrode of the energy storage device. The first insulation detection circuit can be used to collect the negative sampled signal of the energy storage device. The first insulation detection circuit can be simplified as an RC1 charge and discharge circuit in which an equivalent resistor R and the first distributed capacitor C1 are connected in series.

In an embodiment, a power supply for the charge and discharge circuit is in the form of a voltage source. Assuming that the first distributed capacitor C1 is charged through the equivalent resistor R, an initial voltage on the first distributed capacitor C1 is, for example, $V_0$, and a stabilized voltage on the first distribution capacitor C1 is $V_1$, then a charging voltage on the first distributed capacitor C1 at any time t1 can be expressed as the following expression (1):

$$V_{t1}=V_0+(V_1-V_0)\times(1-\exp(-t1/RC1)) \quad (1)$$

The charging time T1 of the first distributed capacitor C1 can be determined by the above expression (1) and expressed as the following expression (2):

$$T1=RC1\times\ln((V_1-V_0)/(V_1-V_{t1})) \quad (2)$$

In the above expressions (1) and (2), $V_{t1}$ represents the voltage value on the first distributed capacitor C1 at any time t1, and RC1 is the product of the resistance value of the equivalent resistor R and the capacitance value of the first distributed capacitor C1. That is, RC1 may represent a time constant, and exp may represent an exponential function with the natural constant e as the base.

It can be seen from the above expression (2) that when the initial voltage value $V_0$ on the first distributed capacitor C1, the voltage value $V_{t1}$ on the first distributed capacitor C1 at the time t1 and the stabilized voltage value $V_1$ on the first distribution capacitor C1 are known, the smaller the resistance value of the equivalent resistor R is, the shorter the charging time is and the shorter the time for the insulation detection circuit equivalent to the RC1 charge circuit to reach a stable state during charging is.

In an RC1 discharge circuit, the first distributed capacitor C1 can be discharged through the equivalent resistor R. Assuming the initial voltage on the first distributed capacitor C1 is $V_0$ and the stabilized voltage on the first distribution capacitor C1 is $V_1$, then a discharging voltage on the first distributed capacitor C1 at any time t2 can be expressed as the following expression (3):

$$V_{t2}=V_0+(V_1-V_0)\times(1-\exp(-t2/RC1)) \quad (3)$$

The discharging time T2 of the first distributed capacitor C1 can be determined by the above expression (3) and expressed as the following expression (4):

$$T2=RC1\times\ln((V_1-V_0)/(V_1-V_{t2})) \quad (4)$$

In the above expressions (3) and (4), $V_{t2}$ represents the voltage value on the first distributed capacitor C1 at any time t2, and RC1 is the product of the resistance value of the equivalent resistor R and the capacitance value of the first distributed capacitor C1. That is, RC1 may represent a time constant, and exp may represent an exponential function with the natural constant e as the base.

It can be seen from the above expression (4) that when the initial voltage value $V_0$ on the first distributed capacitor C1, the voltage value $V_{t2}$ on the first distributed capacitor C1 at the time t2 and the stabilized voltage value $V_1$ on the first distribution capacitor C1 are known, the smaller the resistance value of the equivalent resistor R is, the shorter the discharging time is and the shorter the time for the insulation detection circuit equivalent to the RC1 discharge circuit to reach a stable state during discharging is.

As shown in FIG. 4, the sampling unit F1 includes the first resistor network R1 and the second resistor network R2, the resistance value of the sampling resistor network of the sampling unit F1 is a sum of the resistance value of the first resistor network R1 and the resistance value of the second resistor network R2, and the acceleration resistor network R3 is connected in parallel with the sampling resistor network of the sampling unit F1. Therefore, in the first insulation detection circuit, the resistance value of the equivalent resistor R may be dependent on a total resistance value of the acceleration resistor network R3 in parallel with the first resistor network R1 and the second resistor network R2 of the sampling unit F1.

In an embodiment, if two resistances differ by a large difference, the total parallel resistance will be close to and slightly less than one of the two resistances having a relatively lower resistance value. Therefore, when the first insulation detection circuit is used to collect the negative sampled signal, the acceleration resistor network R3 can be connected in parallel with the sampling unit F1. The smaller the resistance value of the acceleration resistor network R3 is, the smaller the equivalent resistance R of the first insulation detection circuit is, the shorter the charging and discharging time of the first distributed capacitor C1 is, the faster the voltage on the first distributed capacitor C1 is stabilized, the shorter the time for voltage collection is, and the shorter the time for the insulation sampling is.

With continued reference to FIG. 4, in an embodiment, when the sampling isolation switch OM3 and the acceleration switch OM4 are in the switch-on state and the positive switching device OM1 and the negative switching device OM2 are in the first switching state, a second insulation detection circuit may be formed by the positive electrode of the energy storage device, the first resistor network R1, second resistor network R2, the acceleration resistor network R3, the second distributed capacitor C2, and the negative electrode of the energy storage device. The second insulation detection circuit can be used to collect the positive sampled signal of the energy storage device. The second insulation detection circuit can be simplified as an RC2 charge and discharge circuit in which the equivalent resistor R and the second distributed capacitor C2 are connected in series.

According to the above described embodiments, when collecting the positive sampled signal of the energy storage device, the acceleration resistor network R3 can be connected in parallel with the sampling resistor network of the sampling unit F1. The smaller the resistance value of the acceleration resistor network R3 is, the smaller the equivalent resistance R of the second insulation detection circuit is, the shorter the charging and discharging time of the second distributed capacitor C2 is, the faster the voltage on the second distributed capacitor C2 is stabilized, the shorter the time for voltage collection is, and the shorter the time for the insulation sampling is.

It should be noted that the voltage across the acceleration resistor network R3 should meet a preset voltage requirement, and the power of the acceleration resistor network R3 should meet a preset power requirement.

In an embodiment, the resistance value of the acceleration resistor network R3 can be calculated based on the voltage across the acceleration resistor network R3 and the power of the acceleration resistor network R3. The voltage across the acceleration resistor network R3 should be lower than a maximum voltage that the resistor network can withstand under the operating voltage of the energy storage system; and the power of the acceleration resistor network R3 should be less than a rated power of the acceleration resistor network R3.

With continued reference to FIG. 4, in an embodiment, the insulation detection device may further include a processor D1 connected to the sampling unit F1. The processor D1 is configured to calculate the positive insulation resistance value and the negative insulation resistance value of the energy storage device according to the positive sampled signal and the negative sampled signal collected by the sampling unit F1.

In an embodiment, the insulation detection device further includes an analog to digital converter (ADC). The analog to digital converter ADC is connected to the sampling unit F1 and the processor D1, and configured to convert an analog signal acquired by the sampling unit F1 into a digital signal.

As shown in FIG. 4, in an embodiment, the processor D1 may be connected to the insulation detection sampling point S1 and configured to collect the positive sampled signal of the energy storage device via the sampling point S1 when the positive switching device OM1 and the negative switching device OM2 are in the first switching state and collect the negative sampled signal of the energy storage device via the sampling point S1 when the positive switching device OM1 and the negative switching device OM2 are in the second switching state.

Moreover, the processor D1 is configured to calculate a positive insulation resistance value and a negative insulation resistance value of a power battery pack to be tested according to the positive sampled signal and the negative sampled signal.

Figure 5A:
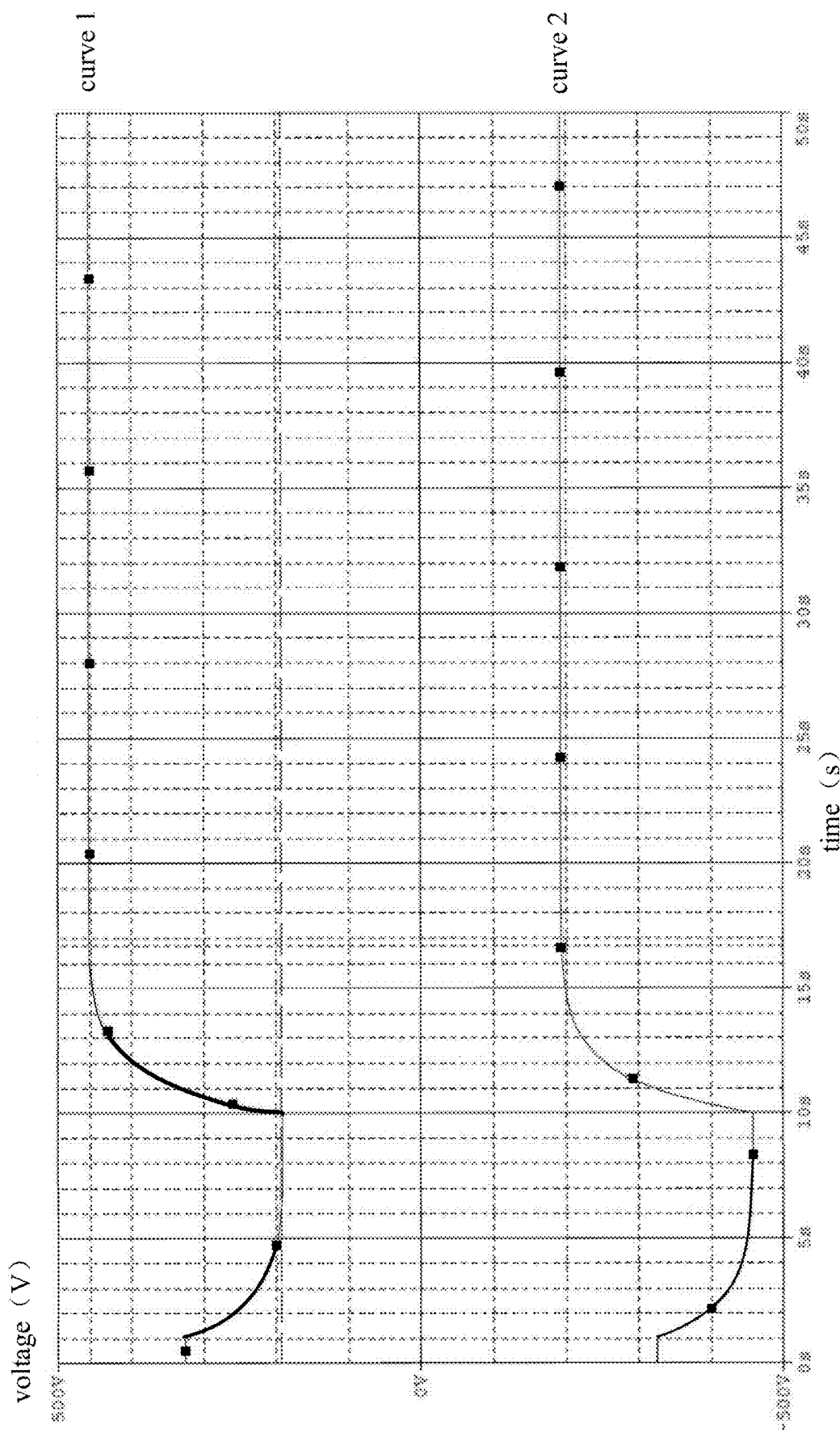
FIG. 5a illustrates a relationship between time and a voltage of an insulation detection circuit when there is no acceleration resistor network connected in the insulation detection circuit.
Figure 5B:
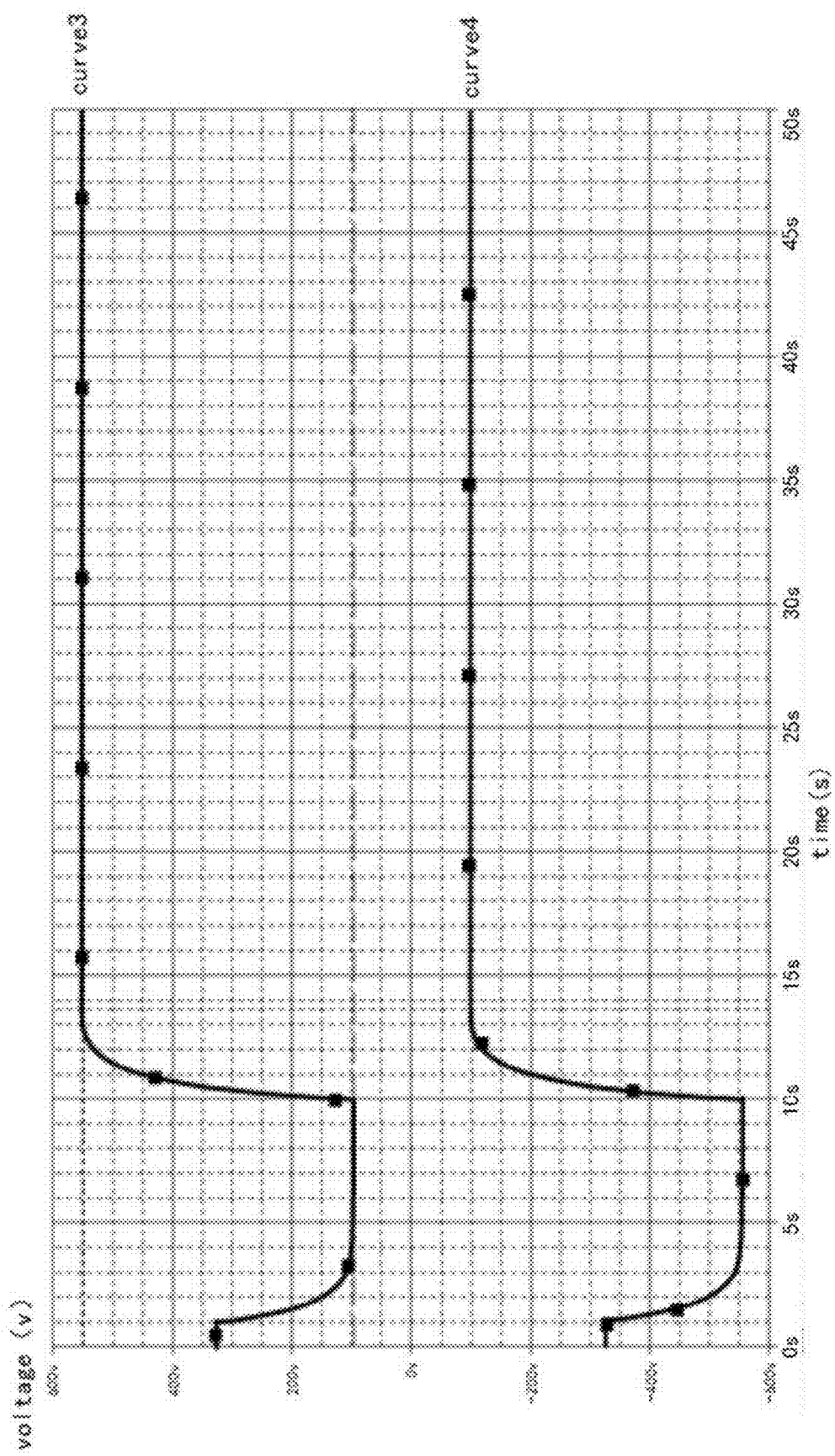
FIG. 5b illustrates a relationship between time and a voltage of an insulation detection circuit when an acceleration resistor network is connected in the insulation detection circuit.

For a better understanding of the present disclosure, a comparison of the effects of paralleling or not paralleling the sampling resistor network of the sampling unit F1 with the acceleration resistor network in the insulation detecting circuit is depicted by FIG. 5a and FIG. 5b. FIG. 5a shows the relationship between time and the voltage of the insulation detection circuit when the acceleration resistor network is not connected in the insulation detection circuit; FIG. 5b shows the relationship between time and the voltage of the insulation detection circuit when the acceleration resistor network is connected in the insulation detection circuit.

In FIG. 5a, curve 1 may be used to depict the relationship between time and the voltage at the high voltage positive electrode of the insulation detection circuit relative to the low voltage ground, when the sampling resistor network of the sampling unit is not connected in parallel with the acceleration resistor network; curve 2 may be used to depict the relationship between time and the voltage at the high voltage negative electrode of the insulation detection circuit relative to the low voltage ground, when the sampling resistor network of the sampling unit is not connected in parallel with the acceleration resistor network.

As can be seen from FIG. 5a, in the embodiment, when the sampling resistor network of the sampling unit F1 is not connected in parallel with the acceleration resistor network, the time for voltage stabilization of the insulation detection circuit is about 6.715 seconds.

In FIG. 5b, curve 3 may be used to depict the relationship between time and the voltage at the high voltage positive electrode of the insulation detection circuit relative to the low voltage ground, when the sampling resistor network of the sampling unit is connected in parallel with the acceleration resistor network; curve 4 may be used to depict the relationship between time and the voltage at the high voltage negative electrode of the insulation detection circuit relative to the low voltage ground, when the sampling resistor network of the sampling unit is connected in parallel with the acceleration resistor network.

As can be seen from FIG. 5b, in the embodiment, when the sampling resistor network of the sampling unit F1 is connected in parallel with the acceleration resistor network, the time for voltage stabilization of the insulation detection circuit is about 3.631 seconds, which is shorter than the time for voltage stabilization when the resistor network of the sampling unit is not connected in parallel with the acceleration resistor network. Therefore, the insulation sampling speed is faster, the insulation sampling efficiency is higher, and the insulation sampling when the voltage is not stable may be avoided so as not to affect the sampling accuracy. In other words, the insulation sampling accuracy may be improved, the sampling time may be shortened, and the sampling efficiency may be improved.

In embodiments of the present disclosure, the charging and discharging time of the equivalent capacitor may be reduced by way of paralleling the sampling circuit of the sampling unit with the acceleration resistor, so that the insulation detection circuit may reach a stable voltage state as fast as possible. Thus the sampling time may be shortened, and the sampling efficiency and the sensitivity of the insulation resistance may be improved.

Figure 6:
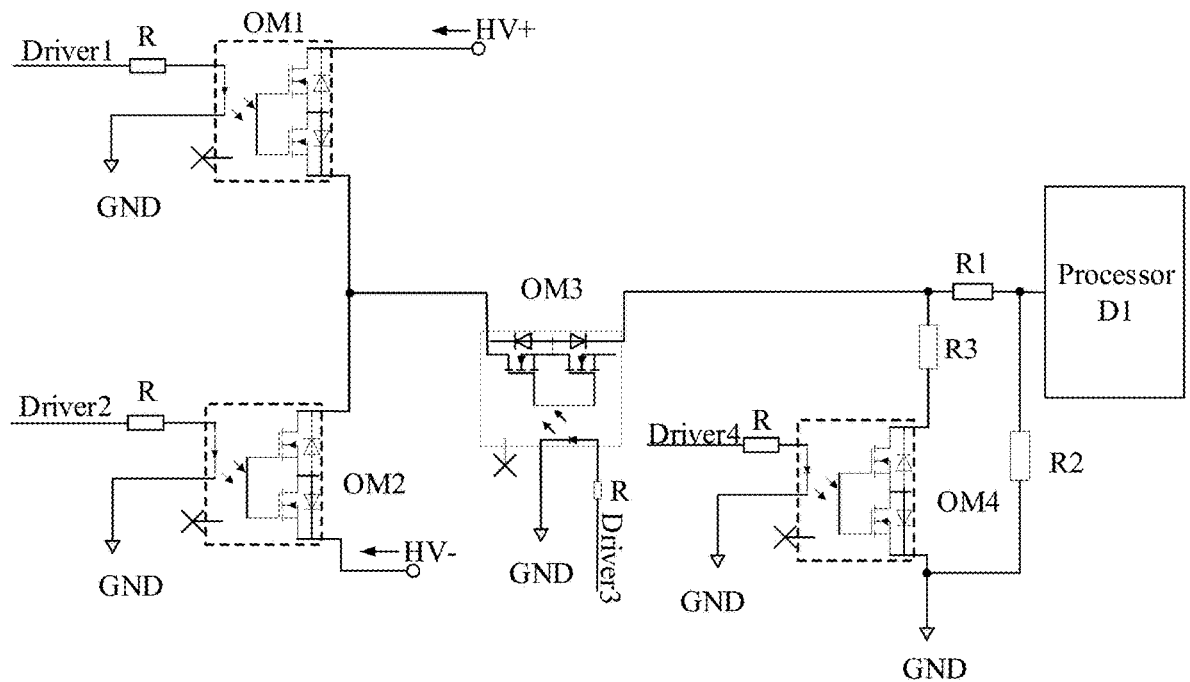
FIG. 6 is a circuit diagram of an insulation detection device sampling an energy storage device according to an exemplary embodiment of the present disclosure.
Figure 7:
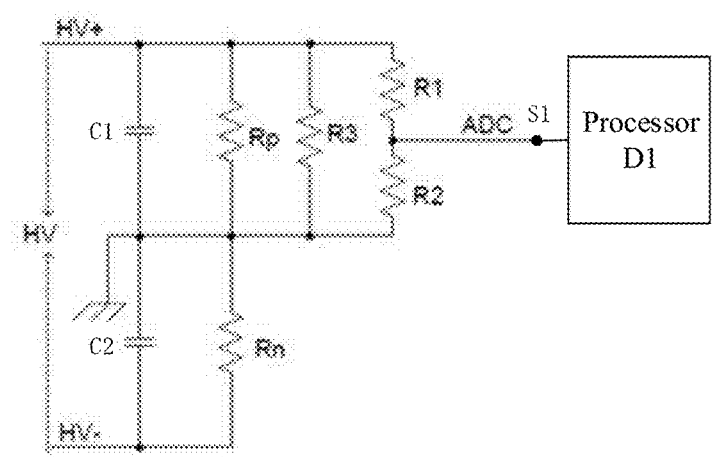
FIG. 7 is a simplified circuit structural diagram of an insulation detection device when collecting a positive sampled signal on an energy storage device according to an embodiment of the present disclosure.
Figure 8:
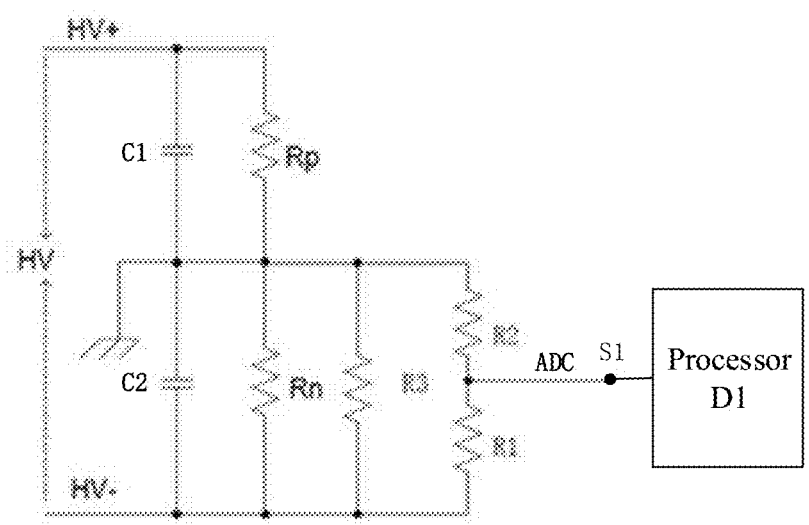
FIG. 8 is a simplified circuit structural diagram of an insulation detection device when collecting a negative sampled signal on an energy storage device according to an embodiment of the present disclosure.

Referring to FIG. 6, FIG. 7, and FIG. 8, methods and steps for implementing insulation detection for the energy storage system by the insulation detection device according to embodiments of the present disclosure will be described in detail by way of specific embodiments.

FIG. 6 is a circuit diagram of the insulation detection device for collecting sampled signals from the energy storage device according to an exemplary embodiment of the present disclosure; FIG. 7 is a simplified circuit structural diagram of the insulation detection device when collecting the positive sampled signal of the energy storage device according to an embodiment of the present disclosure; FIG. 8 is a simplified circuit structural diagram of the insulation detection device when collecting the negative sampled signal of the energy storage device according to an embodiment of the present disclosure.

In an embodiment, it is possible to control the positive switching device to switch on and control the negative switching device to switch off, and collect the first positive sampled signal by the insulation detection device; control the positive switching device to switch off and control the negative switching device to switch on, and collect the first negative sampled signal by the insulation detection device; and calculate the positive insulation resistance value and the negative insulation resistance value of the energy storage device according to the first positive sampled signal and the first negative sampled signal.

In the embodiment, by using the ADC, the first positive sampled signal can be converted into the first positive sampled voltage and the first negative sampled signal can be converted into the first negative sampled voltage. According to the first positive sampled voltage and the first negative sampled voltage, the positive insulation resistance value and the negative insulation resistance value of the energy storage device can be determined.

As shown in FIG. 6, when OM1 is switched on, OM2 is switched off, OM3 is switched on, OM4 is switched off, and the voltage is stabilized, the processor D1 can collect the first positive sampled signal at the sampling point S1, and determine the first positive sampled voltage $U_{c1}$ at the high voltage positive electrode of the energy storage device relative to the low voltage ground when the positive switching device and the negative switching device are in the first switching state. In this case, an input voltage (HV voltage) between the high voltage positive electrode and the high voltage negative electrode in the energy storage system is denoted by $U_{bat}$. Based on the first positive sampled voltage $U_{c1}$ at the high voltage positive electrode relative to the low voltage ground and the input voltage $U_{bat}$ between the high voltage positive electrode and the high voltage negative electrode, the equation shown by the following expression (5) is obtained:

$$U_{c1} \times (1/(R1+R2)+1/Rp) = (U_{bat}-U_{c1})/Rn \quad (5)$$

In the above expression (5), $U_{c1}$ is the first positive sampled voltage at the high voltage positive electrode relative to the low voltage ground, which corresponds to the first positive sampled signal in the energy storage device; R1 is the resistance value of the first resistor network; R2 is the resistance value of the second resistor network; Rp is the positive insulation resistance value; Rn is the negative insulation resistance value; and $U_{bat}$ is the input voltage between the high voltage positive electrode and the high voltage negative electrode.

With continued reference to FIG. 6, when OM1 is switched off, OM2 is switched on, OM3 is switched on, OM4 is switched off, and the voltage is stabilized, the processor D1 can collect the first negative sampled signal at the sampling point S1, and determine the first negative sampled voltage $U_{a1}$ at the high voltage negative electrode of the energy storage device relative to the low voltage ground when the positive switching device and the negative switching device are in the second switching state. That is, the voltage at the high voltage negative electrode relative to the low voltage ground in the energy storage system is the first negative sampled voltage $U_{a1}$. In this case, an input voltage (HV) between the high voltage positive electrode and the high voltage negative electrode in the energy storage system is denoted by $U_{bat}$. Based on the first negative sampled voltage $U_{a1}$ at the high voltage negative electrode relative to the low voltage ground and the input voltage $U_{bat}$ between the high voltage positive electrode and the high voltage negative electrode, the equation shown by the following expression (6) is obtained:

$$(U_{bat}-|U_{a1}|)/Rp=|U_{a1}|\times(1/(R1+R2)+1/Rn) \qquad (6)$$

In the above expression (6), $U_{bat}$ is the input voltage between the high voltage positive electrode and the high voltage negative electrode; $U_{a1}$ is the first negative sampled voltage at the high voltage negative electrode relative to the low voltage ground, which corresponds to the first negative sampled signal in the energy storage system; Rp is the positive insulation resistance value; Rn is the negative insulation resistance value; R1 is the resistance value of the first resistor network; and R2 is the resistance value of the second resistor network.

In some embodiments, the equations of the expression (5) and the expression (6) are combined and solved to obtain the positive insulation resistance value Rp of the energy storage device and the negative insulation resistance value Rn of the energy storage device as shown in the following expression (7).

$$\begin{cases} Rp = (U_{bat} - U_{c1} - |U_{a1}|) \times (R1 + R2)/|U_{a1}| \\ Rn = (U_{bat} - U_{c1} - |U_{a1}|) \times (R1 + R2)/U_{c1} \end{cases} \qquad (7)$$

In the above expression (7), Rp is the positive insulation resistance value; Rn is the negative insulation resistance value; $U_{bat}$ is the input voltage between the high voltage positive electrode and the high voltage negative electrode; $U_{c1}$ is the first positive sampled voltage at the high voltage positive electrode relative to the low voltage ground, which corresponds to the first positive sampled signal in the energy storage device; $U_{a1}$ is the first negative sampled voltage at the high voltage negative electrode relative to the low voltage ground, which corresponds to the first negative sampled signal in the energy storage system; R1 is the resistance value of the first resistor network; and R2 is the resistance value of the second resistor network.

With continued reference to FIG. 6, in an embodiment, it is possible to control the acceleration switch to switch on, control the positive switching device to switch on and control the negative switching device to switch off, and collect the second positive sampled signal by the insulation detection device; control the acceleration switch to switch on, control the positive switching device to switch off and control the negative switching device to switch on, and collect the second negative sampled signal by the insulation detection device; and calculate the positive insulation resistance value and the negative insulation resistance value of the energy storage device according to the second positive sampled signal and the second negative sampled signal.

In the embodiment, the insulation detection method may further include converting the second positive sampled signal into the second positive sampled voltage; converting the second negative sampled signal into the second negative sampled voltage; and calculate the positive insulation resistance value and the negative insulation resistance value of the energy storage device according to the second positive sampled voltage and the second negative sampled voltage.

Specifically, in FIG. 6, when OM1 is switched on, OM2 is switched off, OM3 is switched on, and OM4 is switched on, the simplified circuit structural diagram of the insulation detection device for collecting the second positive sampled signal as shown in FIG. 7 can be obtained.

As illustrated in FIG. 6 and FIG. 7, the positive switching device OM1 and the negative switching device OM2 are in the first switching state, and the acceleration resistor network R3 is in parallel with the first resistor network and the second resistor network of the sampling unit F1.

After the voltage is stabilized, the processor D1 can collect the second positive sampled signal at the sampling point S1, and determine the second positive sampled voltage $U_{c2}$ at the high voltage positive electrode of the energy storage device relative to the low voltage ground when the positive switching device and the negative switching device are in the first switching state. That is, the voltage at the high voltage positive electrode relative to the low voltage ground in the energy storage system is the second positive sampled voltage $U_{c2}$. In this case, an input voltage (HV voltage) between the high voltage positive electrode and the high voltage negative electrode in the energy storage system is denoted by $U_{bat}$. Based on the second positive sampled voltage $U_{c2}$ at the high voltage positive electrode relative to the low voltage ground and the input voltage $U_{bat}$ between the high voltage positive electrode and the high voltage negative electrode, the equation shown by the following expression (8) is obtained:

$$U_{c2}\times(1/(R1+R2)+1/R3+1/Rp)=(U_{bat}-U_{c2})/Rn \qquad (8)$$

In the above expression (8), $U_{c2}$ is the second positive sampled voltage at the high voltage positive electrode relative to the low voltage ground, which corresponds to the second positive sampled signal in the energy storage device; R1 is the resistance value of the first resistor network; R2 is the resistance value of the second resistor network; R3 is the resistance value of the acceleration resistor network; Rp is the positive insulation resistance value; Rn is the negative insulation resistance value; and $U_{bat}$ is the input voltage between the high voltage positive electrode and the high voltage negative electrode.

With continued reference to FIG. 6, when OM1 is switched off, OM2 is switched on, OM3 is switched on, and OM4 is switched on, the simplified circuit structural diagram of the insulation detection device for collecting the second negative sampled signal as shown in FIG. 8 can be obtained.

As illustrated in FIG. 6 and FIG. 8, the positive switching device OM1 and the negative switching device OM2 are in the second switching state, and the acceleration resistor network R3 is in parallel with the first resistor network and the second resistor network of the sampling unit F1.

After the voltage is stabilized, the processor D1 can collect the second negative sampled signal at the sampling point S1, and determine the second negative sampled voltage $U_{a2}$ at the high voltage negative electrode of the energy storage device relative to the low voltage ground when the positive switching device and the negative switching device are in the second switching state. That is, the voltage at the high voltage negative electrode relative to the low voltage ground in the energy storage system is the second negative sampled voltage $U_{a2}$. In this case, an input voltage (HV voltage) between the high voltage positive electrode and the high voltage negative electrode in the energy storage system is denoted by $U_{bat}$. Based on the second negative sampled voltage $U_{a2}$ at the high voltage negative electrode relative to the low voltage ground and the input voltage $U_{bat}$ between the high voltage positive electrode and the high voltage negative electrode, the equation shown by the following expression (9) is obtained:

$$(U_{bat}-|U_{a2}|)/Rp=|U_{a2}|\times(1/(R1+R2)+1/R3+1/Rn) \qquad (9)$$

In the above expression (9), $U_{bat}$ is the input voltage between the high voltage positive electrode and the high voltage negative electrode; $U_{a2}$ is the second negative sampled voltage at the high voltage negative electrode relative to the low voltage ground, which corresponds to the second negative sampled signal in the energy storage system; Rp is the positive insulation resistance value; Rn is the negative insulation resistance value; R1 is the resistance value of the first resistor network; R2 is the resistance value of the second resistor network; and R3 is the resistance value of the acceleration resistor network.

In some embodiments, the equations of the expression (8) and the expression (9) are combined and solved to obtain the positive insulation resistance value Rp of the energy storage device and the negative insulation resistance value Rn of the energy storage device as shown in the following expression (10).

$$\begin{cases} Rp = (U_{bat} - U_{c2} - |U_{a2}|) \times (R1 + R2) \times R3/(R1 + R2 + R3)/|U_{a2}| \\ Rn = (U_{bat} - U_{c2} - |U_{a2}|) \times (R1 + R2) \times R3/(R1 + R2 + R3)/U_{c2} \end{cases} \quad (10)$$

In the above expression (10), Rp is the positive insulation resistance value; Rn is the negative insulation resistance value; $U_{bat}$ is the input voltage between the high voltage positive electrode and the high voltage negative electrode; $U_{c2}$ is the second positive sampled voltage at the high voltage positive electrode relative to the low voltage ground, which corresponds to the second positive sampled signal in the energy storage device; $U_{a2}$ is the second negative sampled voltage at the high voltage negative electrode relative to the low voltage ground, which corresponds to the second negative sampled signal in the energy storage system; R1 is the resistance value of the first resistor network; R2 is the resistance value of the second resistor network; and R3 is the resistance value of the acceleration resistor network.

In an embodiment, the insulation detection method may further include determine a lower resistance value of the positive insulation resistance value and the negative insulation resistance value as an insulation resistance value of the energy storage system; compare the insulation resistance value of the energy storage system and a preset insulation resistance threshold to obtain a comparison result of the insulation resistance value of the energy storage system; and determine an insulation state of the energy storage system according to the comparison result of the insulation resistance value of the energy storage system.

In an embodiment, if the insulation resistance value of the energy storage system is higher than the preset insulation resistance threshold, it may be determined that the insulation state of the energy storage system is an alarm state and an alarm message may be input according to the alarm state of the energy storage system.

In the embodiment, by real-time monitoring whether the insulation resistance value of the energy storage system reaches the standard, it is possible to avoid the safety problem caused by the insulation resistance value between the positive and negative electrodes of the energy storage system failing to meet the standard.

Moreover, in the embodiments of the present disclosure, the insulation detection can be implemented by a single sampling module, thereby avoiding the influence of a multi-channel AD sampling difference on the insulation detection. Further, when the acceleration resistor is connected in parallel on the sampling unit, a fast insulation sampling can be realized, and the sensitivity of the insulation resistance can be improved.

It should be noted that the processor D1 in the embodiments of the present disclosure may be a processing device dedicated to the insulation detection circuit, or may be a processing device to be shared with other circuits. The insulation detection circuit can be an independent circuit structure or a part of an overall circuit structure.

Illustratively, the insulation detection device in the embodiments of the present disclosure may be integrated in a battery management system of an energy storage device such as a power battery pack of a new energy vehicle. A part of an overall circuit structure of the battery management system may be used for insulation detection on the energy storage device, and a central processing unit of the battery management system may calculate the positive insulation resistance value and the negative insulation resistance value of the energy storage device.

The above embodiments may be implemented entirely or partly by software, hardware, firmware or any combination thereof. When it is implemented by software, it may be entirely or partly implemented as a computer program product or a computer readable storage medium. The computer program product or the computer readable storage medium includes one or more computer instructions. When the computer program instructions are loaded and executed on a computer, they entirely and partly produce the flowchart or functions described in the embodiments of the present disclosure. The computer may be a general purpose computer, a special purpose computer, a computer network, or another programmable apparatus. The computer instructions may be stored in the computer readable storage medium or may be transmitted from a computer readable storage medium to another computer readable storage medium. For example, the computer instructions may be transmitted by wire (for example, coaxial cable, optical fiber, digital subscriber line (DSL)) or wireless (for example, infrared, radio, microwave and so on) from a website, computer, server or data center to another website, computer, server or data center. The computer readable storage medium may be any applicable medium accessible by the computer or a data storage device such as a server or a data center integrated with one or more applicable media. The applicable medium may be a magnetic medium (for example, a soft disk, a hard disk, a magnetic tape), an optical medium (for example, a DVD) or a semiconductor medium (for example, a solid state disk (SSD)) and so on.

It is to be understood that the embodiments of the present disclosure are not limited to the specific configurations and processes described above and shown in the drawings. Also, for the purpose of concision, the detailed description of known technique is omitted herein. In the above embodiments, a number of specific steps are described and illustrated as examples. However, the processes of the embodiments of the present disclosure are not limited to the specific steps described and illustrated. A person skilled in the art may make various changes, modifications and additions, or change the order of the steps after understanding the spirit of the present disclosure.

The above description is only for illustrating the specific embodiments of the present disclosure. It will be apparent to those skilled in the art that, for the sake of convenience and simplicity of description, specific operating processes of the systems, units and elements described above may be known by referring to corresponding processes in the foregoing method embodiments, and will not be repeated herein. It is to be understood that the scope of the present disclosure is not limited thereto. Within the technical scope of the present disclosure, various modifications or substitutions may be readily apparent to those skilled in the art, and all of the modifications or substitutions are to be included within the scope of the present disclosure.

What is claimed is:

1. An insulation detection device for an energy storage system, comprising:
    a positive switching device, a negative switching device, a sampling unit, a reference voltage terminal and a processor, wherein:
    a positive electrode of an energy storage device is connected to a first end of the positive switching device, a negative electrode of the energy storage device is connected to a first end of the negative switching device, a second end of the positive switching device and a second end of the negative switching device are respectively connected to a first end of the sampling unit, and a second end of the sampling unit is connected to the reference voltage terminal;
    the sampling unit is configured to collect a positive sampled signal on the energy storage device when the positive switching device and the negative switching device are in a first switching state, and to collect a negative sampled signal on the energy storage device when the positive switching device and the negative switching device are in a second switching state;
    the sampling unit comprises: a sampling isolation switch, a first resistor network and a second resistor network;
    a first end of the sampling isolation switch is connected to the second end of the positive switching device and the second end of the negative switching device;
    a second end of the sampling isolation switch is connected to a first end of the first resistor network; and
    a second end of the first resistor network is connected to a first end of the second resistor network; and a second end of the second resistor network is connected to the reference voltage terminal,
    wherein the insulation detection device further comprises an acceleration switch and an acceleration resistor network, wherein:
    a first end of the acceleration switch is connected to the first end of the first resistor network, and a second end of the acceleration switch is connected to a first end of the acceleration resistor network;
    a second end of the acceleration resistor network is connected to the second end of the second resistor network;
    the sampling isolation switch and the acceleration switch are controlled to be in a switch-on state when the positive switching device and the negative switching device are in the second switching state, so as to form a first insulation detection circuit including the positive electrode of the energy storage device, a first distributed capacitor, the first resistor network, the second resistor network, the acceleration resistor network, and the negative electrode of the energy storage device, wherein the first distributed capacitor exists between the positive electrode of the energy storage device and the reference voltage terminal, the second switching state comprises a switch-off state of the positive switching device and a switch-on state of the negative switching device; and
    the sampling isolation switch and the acceleration switch are controlled to be in the switch-on state when the positive switching device and the negative switching device are in the first switching state, so as to form a second insulation detection circuit including the positive electrode of the energy storage device, the first resistor network, the second resistor network, the acceleration resistor network, a second distributed capacitor, and the negative electrode of the energy storage device, wherein the second distributed capacitor exists between the negative electrode of the energy storage device and the reference voltage terminal, the first switching state comprises a switch-on state of the positive switching device and a switch-off state of the negative switching device,
    wherein the processor is connected to a third end of the sampling unit and configured to:
    determine a positive insulation resistance value and a negative insulation resistance value of the energy storage device according to the positive sampled signal and the negative sampled signal;
    determine a lower resistance value of the positive insulation resistance value and the negative insulation resistance value as an insulation resistance value of the energy storage system;
    compare the insulation resistance value of the energy storage system and a preset insulation resistance threshold to obtain a comparison result of the insulation resistance value of the energy storage system; and
    determine an insulation state of the energy storage system according to the comparison result of the insulation resistance value of the energy storage system.

2. The insulation detection device for the energy storage system of claim 1, further comprising an insulation detection sampling point positioned at the third end of the sampling unit and connected to the processor, wherein:
    the sampling unit is further configured to collect the positive sampled signal on the energy storage device via the insulation detection sampling point when the positive switching device and the negative switching device are in the first switching state; and collect the negative sampled signal on the energy storage device via the insulation detection sampling point when the positive switching device and the negative switching device are in the second switching state.

3. The insulation detection device for the energy storage system of claim 1, further comprising an insulation detection sampling point connected to the second end of the first resistor network, the first end of the second resistor network and the processor.

4. The insulation detection device for the energy storage system of claim 1, wherein:
    the positive switching device comprises a positive isolation switch, and the positive electrode of the energy storage device is connected to the first end of the sampling unit through the positive isolation switch; and
    the negative switching device comprises a negative isolation switch, and the negative electrode of the energy storage device is connected to the first end of the sampling unit through the negative isolation switch.

5. An insulation detection method for an energy storage system to be implemented in the insulation detection device for the energy storage system of claim 1, the insulation detection method comprising:
    controlling the sampling isolation switch and the acceleration switch to switch on, the positive switching device to switch on and the negative switching device to switch off, and collecting a positive sampled signal by the insulation detection device;

controlling the sampling isolation switch and the acceleration switch to switch on, the positive switching device to switch off and the negative switching device to switch on, and collecting a negative sampled signal by the insulation detection device;

calculating the positive insulation resistance value and the negative insulation resistance value of the energy storage device according to the positive sampled signal and the negative sampled signal;

determining the lower resistance value of the positive insulation resistance value and the negative insulation resistance value as the insulation resistance value of the energy storage system;

comparing the insulation resistance value of the energy storage system and the preset insulation resistance threshold to obtain the comparison result of the insulation resistance value of the energy storage system; and determining the insulation state of the energy storage system according to the comparison result of the insulation resistance value of the energy storage system.

6. The insulation detection method for the energy storage system of claim 5, wherein the calculating the positive insulation resistance value and the negative insulation resistance value of the energy storage device according to the positive sampled signal and the negative sampled signal comprises:

converting the positive sampled signal into a positive sampled voltage;

converting the negative sampled signal into a negative sampled voltage; and calculating the positive insulation resistance value and the negative insulation resistance value of the energy storage device according to the positive sampled voltage and the negative sampled voltage.

7. The insulation detection device for the energy storage system of claim 1, wherein a voltage across the acceleration resistor network is lower than a maximum voltage withstandable by the acceleration resistor network under an operating voltage of the energy storage system; and a power of the acceleration resistor network is less than a rated power of the acceleration resistor network.

\* \* \* \* \*